(12) United States Patent
Coenen

(10) Patent No.: US 10,295,600 B2
(45) Date of Patent: May 21, 2019

(54) MONITORING CHARGE STORED IN A BATTERY

(71) Applicant: VLAAMSE INSTELLING VOOR TECHNOLOGISCH ONDERZOEK NV (VITO NV), Mol (BE)

(72) Inventor: Peter Coenen, Glabbeek (BE)

(73) Assignee: VLAAMSE INSTELLING VOOR TECHNOLOGISCH ONDERZOEK NV (VITO NV), Mol (BE)

(*) Notice: Subject to any disclaimer, the term of this patent is extended or adjusted under 35 U.S.C. 154(b) by 0 days.

(21) Appl. No.: 14/897,962

(22) PCT Filed: Jun. 18, 2014

(86) PCT No.: PCT/EP2014/062858
§ 371 (c)(1),
(2) Date: Dec. 11, 2015

(87) PCT Pub. No.: WO2014/202684
PCT Pub. Date: Dec. 24, 2014

(65) Prior Publication Data
US 2016/0139210 A1    May 19, 2016

(30) Foreign Application Priority Data

Jun. 18, 2013 (EP) ..................... 13172582

(51) Int. Cl.
*G01R 31/36* (2006.01)
*B60L 11/18* (2006.01)
*B60L 3/00* (2019.01)

(52) U.S. Cl.
CPC ........ *G01R 31/3648* (2013.01); *B60L 3/0046* (2013.01); *B60L 11/1857* (2013.01);
(Continued)

(58) Field of Classification Search
CPC ................ G01R 31/66; G01R 31/3648; G01R 31/3624; G01R 31/3651; H01M 10/48;
(Continued)

(56) References Cited

U.S. PATENT DOCUMENTS 6,118,275 A * 9/2000 Yoon .................. G01R 31/3624
320/129
2006/0276981 A1* 12/2006 Aridome ............ G01R 31/3648
702/64
(Continued)

FOREIGN PATENT DOCUMENTS

CN    1864072 A    11/2006
DE    3520985 A1   12/1986
(Continued)

OTHER PUBLICATIONS

International Search Report (ISR) dated Dec. 18, 2014, for PCT/EP2014/062858.
(Continued)

*Primary Examiner* — Mohamed Charioui
*Assistant Examiner* — Eyob Hagos
(74) *Attorney, Agent, or Firm* — Bacon & Thomas, PLLC

(57) ABSTRACT

A method and corresponding device, for monitoring a charge of a battery. The method obtains a battery current measurement value and a battery voltage measurement value, and applies a current integration method to update a primary charge estimate value representative of the charge stored in the battery by taking into account the battery current measurement value. The method further determines an ancillary charge estimate value representative of the charge stored in the battery using a battery model taking into account the battery voltage measurement value, and determines an error value for the ancillary charge estimate value, in which the error value expresses the reliability of the battery model. The (Continued)

method also applies a correction to the primary charge estimate value as function of the ancillary charge estimate value and the error value. Interpretation of the correction applied in this manner allows determination of current sensor offset and battery capacity change.

12 Claims, 2 Drawing Sheets

(52) U.S. Cl.
CPC ...... *B60L 11/1861* (2013.01); *G01R 31/3624* (2013.01); *G01R 31/3651* (2013.01); *B60L 2240/545* (2013.01); *B60L 2240/547* (2013.01); *B60L 2240/549* (2013.01); *B60L 2240/80* (2013.01); *B60L 2260/44* (2013.01); *Y02T 10/7005* (2013.01); *Y02T 10/705* (2013.01); *Y02T 10/7044* (2013.01)

(58) Field of Classification Search
CPC .... H01M 10/44; H01M 10/443; H02J 7/0022; Y02E 60/12; Y02T 10/7005; B60L 3/0046; B60L 11/1861; B60L 11/1857; B60L 2240/545
See application file for complete search history.

(56) References Cited

U.S. PATENT DOCUMENTS

| | | | |
|---|---|---|---|
| 2009/0189613 A1 | 7/2009 | Plett | |
| 2010/0318252 A1* | 12/2010 | Izumi | B60K 6/28 701/22 |
| 2013/0297243 A1 | 11/2013 | Baba et al. | |
| 2014/0257726 A1 | 9/2014 | Baba et al. | |

FOREIGN PATENT DOCUMENTS

| | | |
|---|---|---|
| EP | 1614877 A1 | 6/2006 |
| EP | 1674877 A1 | 6/2006 |
| EP | 2765436 A1 | 8/2014 |
| EP | 2848952 A1 | 3/2015 |
| JP | 201167088 | 3/2011 |
| JP | 2013238402 A | 11/2013 |
| WO | 2012/098770 A1 | 7/2012 |
| WO | 2013/051241 A1 | 4/2013 |

OTHER PUBLICATIONS

Written Opinion dated Dec. 18, 2014, for PCT/EP2014/062858.
International Preliminary Report on Patentability (IPRP) dated Sep. 14, 2015, for PCT/EP2014/062858.
European Search Report dated Nov. 19, 2013 for EP 13172582.
Office Action in Chinese Application No. 201480034249.2, dated Dec. 8, 2017.
First Office Action in related Japanese Application No. 2016-520471, dated Feb. 6, 2018.
Office Action in corresponding Chinese application CN 201480034249.2 dated Aug. 20, 2018.

* cited by examiner

MONITORING CHARGE STORED IN A BATTERY

FIELD OF THE INVENTION

The present invention relates to the field of battery charge monitoring. More specifically it relates to a method and device for determining the amount of stored energy and the total energy storage capacity of a battery, such as a battery power source in a vehicle as well as determining a systematic error in the battery current measured value.

BACKGROUND OF THE INVENTION

The state-of-charge of a battery may be defined as the amount of electrical energy stored in a battery at a given time, expressed as a percentage of the energy when the battery is fully charged. A need for accurate estimation of this state of charge of a battery power supply exists for many applications, for example in motor vehicles such as electric vehicles and hybrid electric vehicles. Methods known in the art for determining the state of charge of batteries in vehicles may use specific gravity measurements, time-integration of current, voltage measurements, or combinations thereof.

For example, the state of charge may be determined by current integration, which also may be referred to as Coulomb counting, charge counting or Ampere-hour measurement. In current integration methods, the discharge current is continuously measured and integrated over time to obtain an estimate of total expended charge from a known initial amount of charge. However, it may be required to take changes in battery capacity as a function of current discharge history into account to maintain accurate state of charge estimates over the battery lifetime.

Furthermore, the state of charge estimated by current integration may be periodically calibrated by measuring the off-load voltage of the idle battery, e.g. after an extended period of inactivity of the vehicle. A method of this type is, for example, described in German Patent No. DE 35 20 985. Although such methods may be easy to implement, estimation errors may accumulate over long operating phases of the vehicles, having relatively short or only few rest periods, because the state of charge may only seldom be re-calibrated or corrected via a measurement of the off-load voltage.

Other known methods may be based on battery models for determining the off-load voltage for a battery under load, and hence the state of charge derivable from this off-load voltage, via adaptation of a model to the actual battery using observed variables, such as battery voltage, battery current, and/or battery temperature. However, such model-based methods may be relatively complex.

Voltage analysis methods may measure the terminal voltage and determine state-of-charge in various manners. With respect to such analyzers, polarization effects, e.g. as caused by charging or fast discharging, can adversely change the indication of the analyzer meters, and most such analyzers tend to be only uni-directional, for example, may work accurately on discharge only, with no provision for aging effects.

SUMMARY OF THE INVENTION

It is an object of embodiments of the present invention to provide good estimation and monitoring of battery parameters, such as state of charge and state of health or systematic errors such as in the battery current measured value.

The above objective is accomplished by a method and device according to the present invention.

In a first aspect, the present invention provides a method for monitoring a charge of a battery. The method comprises obtaining a battery current measurement value and a battery voltage measurement value; applying a current integration method to update a primary charge estimate value representative of the charge stored in the battery by taking into account the battery current measurement value; determining an ancillary charge estimate value representative of the charge stored in the battery using a battery model taking into account the battery voltage measurement value; determining an error value for said ancillary charge estimate value, said error value expressing the reliability of said battery model taking the battery voltage measurement value into account; applying a correction to the primary charge estimate value as function of the ancillary charge estimate value and the error value; and determining a systematic error of the battery current measurement value taking into account said correction to the primary charge estimate value. It is an advantage of a method according to embodiments of the present invention that lower cost sensors can be used for monitoring the charge of a battery, without the need for specific calibration of offset.

A method according to embodiments of the present invention may further comprise a step of determining a total charge capacity of the battery taking into account said correction to the primary charge estimate value. This way, capacity change over time can be monitored, whereby capacity change over time is a measure for battery ageing or state of health (SOH).

In a method according to embodiments of the present invention, applying the current integration method may comprise performing a prediction step of a linear quadratic estimation method for recursively updating an estimated quantity e.g. said primary charge estimate value which reflects an underlying system state such as the charge stored in the battery, taking into account a sequence of noise input data whereby the filter can include a control variable commensurate with said battery current measurement value. Such a filter can be a Kalman filter to update said primary charge estimate value, wherein said primary charge estimate value is a Kalman prediction value of a hidden state variable corresponding to the charge stored in the battery, and said Kalman filter further comprises a control variable commensurate with said battery current measurement value. Alternative or equivalent filters that can be used instead of a Kalman filter as described are for example any of: a Sequential Kalman filter, an Information filter, a Cholesky matrix square root algorithm, a Potter's square root measurement-update algorithm, the Household algorithm, the Gram-Schmidt algorithm, the U-D measurement update, the U-D time update, or the particle filter.

In such method according to embodiments of the present invention, applying the correction may comprise applying an update step of said linear quadratic estimation method such as said Kalman filter, in which said linear quadratic estimation method such as said Kalman filter further comprises an observation variable commensurate with the ancillary charge estimate value having an associated variance commensurate with said error value.

In a method according to embodiments of the present invention, the linear quadratic estimation method such as said Kalman filter may be a one-dimensional linear quadratic estimation method, e.g. a one dimensional Kalman filter. This is advantageous w.r.t. to other Kalman filter approaches, which involve a plurality of state variables, whereas here, with the one dimensional linear quadratic estimation method such as said one-dimensional Kalman filter, only the battery charge needs to be considered a hidden state variable for the filter such as the Kalman filter. This drastically cuts computation time and therefor costs of embedded processors. Alternative or equivalent filters that can be used instead of a Kalman filter as described are for example any of: a Sequential Kalman filter, an Information filter, a Cholesky matrix square root algorithm, a Potter's square root measurement-update algorithm, the Household algorithm, the Gram-Schmidt algorithm, the U-D measurement update, the U-D time update, or the particle filter.

In a method according to embodiments of the present invention, the ancillary charge estimate value may comprise a state-of-charge value expressed as fraction of a total charge capacity of the battery.

In a method according to embodiments of the present invention, determining the ancillary charge estimate value may comprise determining an electromotive force (EMF) of the battery.

In a method according to embodiments of the present invention, determining the ancillary charge estimate value may further take into account the battery current measurement value and/or a battery temperature measurement.

In a second aspect, the present invention provides a device for monitoring the charge of a battery. The device comprises a current sensor for providing a battery current measurement value; a voltage sensor for providing a battery voltage measurement value; and a processing unit. The processing unit is adapted for applying a current integration method to update a primary charge estimate value representative of the charge stored in the battery by taking into account the battery current measurement value; for determining an ancillary charge estimate value representative of the charge stored in the battery using a battery model taking into account the battery voltage measurement value; for determining an error value for said ancillary charge estimate value, said error value expressing the reliability of said battery model taking the battery voltage measurement value into account; for applying a correction to the primary charge estimate value as function of the ancillary charge estimate value and the error value; and for determining a systematic error of the battery current measurement value taking into account said correction to the primary charge estimate value.

It is an advantage of a device according to embodiments of the present invention that lower cost sensors can be used for monitoring the charge of a battery, without the need for specific calibration of offset.

A device according to embodiments of the present invention may further comprise a means for determining a total charge capacity of the battery taking into account said correction to the primary charge estimate value. This way, capacity change over time can be monitored, whereby capacity change over time is a measure for battery ageing or state of health (SOH).

In a device according to embodiments of the present invention, processing unit is adapted for applying the current integration may comprise means for performing a prediction step of a linear quadratic estimation method for recursively updating an estimated quantity e.g. said primary charge estimate value which reflects an underlying system state such as the charge stored in the battery, taking into account a sequence of noise input data whereby the filter can include a control variable commensurate with said battery current measurement value. Such a filter can be a Kalman filter to update said primary charge estimate value, wherein said primary charge estimate value is a Kalman prediction value of a hidden state variable corresponding to the charge stored in the battery, and said Kalman filter further comprises a control variable commensurate with said battery current measurement value. Alternative or equivalent filters that can be used instead of a Kalman filter as described are for example any of: a Sequential Kalman filter, an Information filter, a Cholesky matrix square root algorithm, a Potter's square root measurement-update algorithm, the Household algorithm, the Gram-Schmidt algorithm, the U-D measurement update, the U-D time update, or the particle filter.

In such device according to embodiments of the present invention, means for applying the correction may comprise means for applying an update step of said linear quadratic estimation method such as said Kalman filter, in which said linear quadratic estimation method such as said Kalman filter further comprises an observation variable commensurate with the ancillary charge estimate value having an associated variance commensurate with said error value.

In a device according to embodiments of the present invention, the linear quadratic estimation method such as said Kalman filter may be a one-dimensional linear quadratic estimation method, e.g. a one dimensional Kalman filter. This is advantageous w.r.t. to other Kalman filter approaches, which involve a plurality of state variables, whereas here, with the one dimensional linear quadratic estimation method such as said one-dimensional Kalman filter, only the battery charge needs to be considered a hidden state variable for the filter such as the Kalman filter. This drastically cuts computation time and therefor costs of embedded processors. Alternative or equivalent filters that can be used instead of a Kalman filter as described are for example any of: a Sequential Kalman filter, an Information filter, a Cholesky matrix square root algorithm, a Potter's square root measurement-update algorithm, the Household algorithm, the Gram-Schmidt algorithm, the U-D measurement update, the U-D time update, or the particle filter.

In a device according to embodiments of the present invention, the ancillary charge estimate value may comprise a state-of-charge value expressed as fraction of a total charge capacity of the battery.

In a device according to embodiments of the present invention, means for determining the ancillary charge estimate value may comprise means for determining an electromotive force (EMF) of the battery.

In a device according to embodiments of the present invention, means for determining the ancillary charge estimate value may further take into account the battery current measurement value and/or a battery temperature measurement.

In a further aspect, the present invention provides the use of a device according to embodiments of the second aspect of the present invention, for monitoring the charge stored in a battery.

In particular embodiments, the present invention provides the use of a device according to embodiments of the second aspect of the present invention for monitoring the charge stored in a battery for powering an electric or hybrid vehicle. In particular embodiments, the use may be for monitoring the charge stored in a battery for powering an electric power back-up unit.

It is an advantage of embodiments of the present invention that monitoring of the state of charge and the state of health, e.g. evolution of the total capacity, of a battery is provided in a simple and efficient manner.

It is an advantage of embodiments of the present invention that monitoring of battery parameters is provided which is robust to noisy electric measurements.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
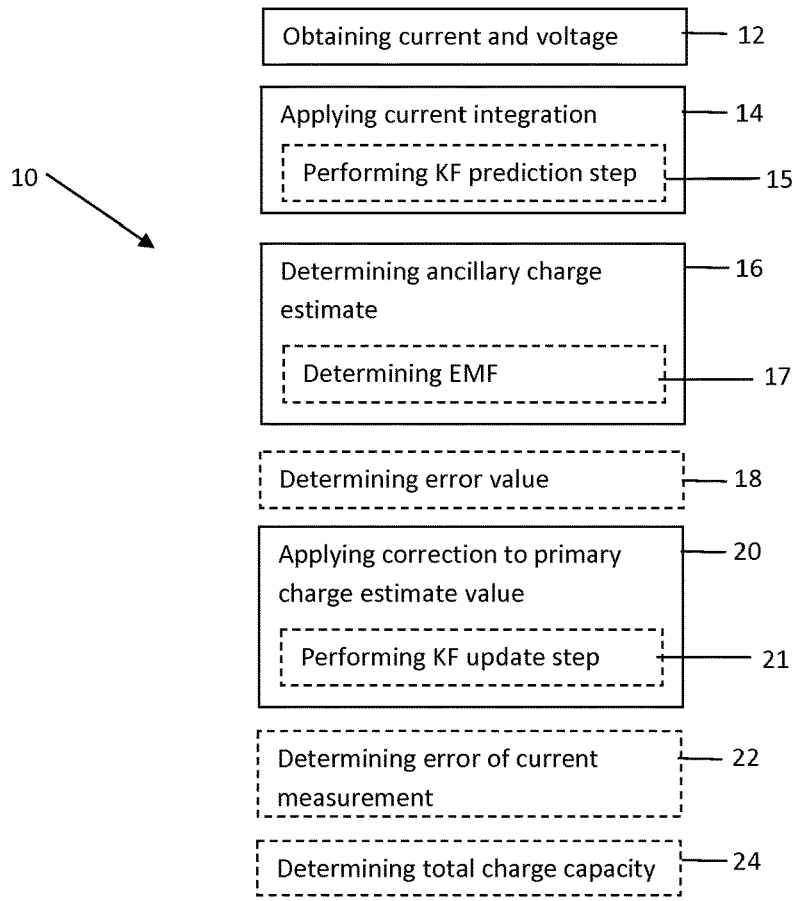
FIG. 1 schematically illustrates a method according to embodiments of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF THE INVENTION

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to 'state-of-charge' or 'SOC', reference is made to a measure of remaining electrical charge, or remaining energy, stored in a battery device, for example, an estimated remaining power level relative to the maximum energy storage capacity of the battery.

Where in embodiments of the present invention reference is made to a "Kalman filter", reference is made to a linear quadratic estimation method for recursively updating an estimated quantity which reflects a underlying system state, taking into account a sequence of noise input data. A Kalman filter may also be referred to as a "Kalman-Bucy filter" or a "Stratonovich-Kalman-Bucy filter". Kalman filters are described in the book "Fundamentals of Kalman Filtering", Paul Zarchen and Howard Musoff, AIAA, 2000, ISBN 1-56347-455-7. As stated in this book alternative and/or equivalent filters can be constructed by altering the way the gain is calculated. For example, the book states that a first order recursive least squares filter can be equivalent to a Kalman filter—the difference being only in the gains. Embodiments of the present invention also allow the gain to be a constant.

The book "Optimal state estimation" by Dan Simon, John Wiley & Son, 2006 provides alternate filters to the Kalman filter described, for example any of: a Sequential Kalman filter, an Information filter, a Cholesky matrix square root algorithm, a Potter's square root measurement-update algorithm, the Household algorithm, the Gram-Schmidt algorithm, the U-D measurement update, the U-D time update, or the particle filter. In a first aspect, the present invention relates to a method for monitoring a state of a battery, e.g. for monitoring the state-of-charge of a battery, or for monitoring the state-of-charge and total energy storage capacity of a battery. Referring to FIG. 1, such a method 10 according to embodiments of the present invention is illustrated in schematic form. The battery monitored may for example be a battery in a motorized vehicle, e.g. a battery for powering an electric vehicle or a hybrid vehicle.

The method 10 comprises the step of obtaining 12 a battery current measurement value and a battery voltage measurement value. For example, a battery current $I_L$ entering or leaving the battery may be registered by an ammeter and recorded at regular time intervals. Furthermore, a battery voltage $V_L$ over the battery poles may be similarly registered by a voltmeter and recorded at regular time intervals. For example, current $I_L$ and voltage $V_L$ may be sampled at a predetermined sampling frequency by an analog-to-digital converter and provided to a processing unit. Battery current $I_L$ and battery voltage $V_L$ may also be referred to as a load current and a load voltage. In addition to obtaining 12 a battery current measurement value and a battery voltage measurement value, other operational characteristics of the battery may be obtained for example by measuring, e.g. a battery temperature measurement value may also be obtained.

The method further comprises applying 14 a current integration method to update a primary charge estimate value representative of the charge stored in the battery, e.g. a charge estimate value intended to be proportional to the electrical charge currently stored in the battery, by taking into account the battery current measurement value. For example, at a k'th time instance $t_k = t_{k-1} + \Delta t$, the primary charge estimate value $Q_{k-1}$ determined at the previous time instance $t_{k-1}$ may be adjusted to yield a new primary charge estimate value $Q_k$, e.g. according to $Q_k = I_L \cdot \Delta t$. This current integration can be implemented, according to embodiments of the present invention, as a prediction step of a one-dimensional linear quadratic estimation method for recursively updating an estimated quantity which reflects a underlying system state, taking into account a sequence of noise input data, where the primary charge estimate value may be considered as an a-priori state estimate of a scalar hidden state variable, e.g. representing the true, yet unknown, electrical charge stored in the battery, based on an a-posteriori state estimate of the previous time instance, e.g. the previously determined primary charge estimate value. So for example this current integration can be implemented, according to embodiments of the present invention, as a prediction step $\tilde{x} = F_k \hat{x}_{k-1} + B_{k-1} u_{k-1}$ of a one-dimensional Kalman filter, where the primary charge estimate value $Q_n$ may be considered as an a-priori state estimate $\tilde{x}$ of a scalar hidden state variable $x_k$, e.g. representing the true, yet unknown, electrical charge stored in the battery, where $\hat{x}_k$ represents an a-posteriori state estimate of the previous time instance, e.g. the previously determined primary charge estimate value. In such Kalman filter, the state-transition model $F_k$ and the control-input model $B_k$ can both be set to a constant scalar value of one, thus for example $F_k = B_k = 1$, while the current-time product $I_L \cdot \Delta t$ can be considered as the control variable $u_{k-1}$. It will, however, be apparent to a person skilled in the art that such variables and parameters may be rescaled, e.g. the control-input model may be set to the time-increment $\Delta t$ and the load current $I_L$ may be considered as control variable. Alternative filters that could be used are for example any of: a Sequential Kalman filter, an Information filter, a Cholesky matrix square root algorithm, a Potter's square root measurement-update algorithm, the Household algorithm, the Gram-Schmidt algorithm, the U-D measurement update, the U-D time update, or the particle filter.

Furthermore, the method according to embodiments of the present invention also comprises determining 16 an ancillary charge estimate value $z_k$ representative of the charge stored in the battery, e.g. a relative charge state of the battery, such as a state-of-charge (SOC) value expressed as fraction of the total charge capacity of the battery. Determining 16 the ancillary charge estimate value $z_k$ may be performed by using a battery model taking into account the battery voltage measurement value $V_L$. Such battery model may furthermore take into account the battery current measurement value $I_L$ and/or a battery temperature. This determining 16 the ancillary charge estimate value may comprise determining 17 an electromotive force (EMF) of the battery.

Figure 2:
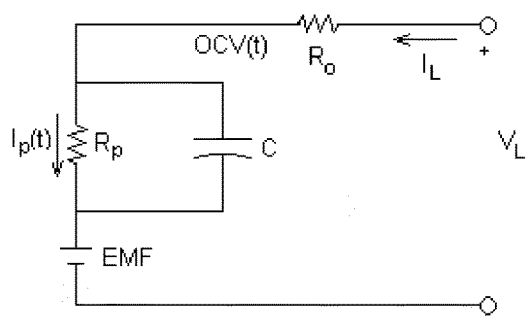
FIG. 2 shows an exemplary battery model for use in embodiments according to the present invention.

For example, the battery model may be an electrical model, e.g. an equivalent electric circuit model, as shown in FIG. 2, with a series resistor $R_0$ and an RC parallel network $R_p // C$, from which the open circuit voltage may be derived taking into account the battery voltage measurement value $V_L$ and the battery current measurement value $I_L$, e.g. $EMF = V_L - R_0 \cdot I_L - I_P \cdot R_P$. Furthermore, a predetermined model, e.g. a predetermined calibration curve, may be used to determine the relative charge state of the battery, which may be a state of charge (SOC) expressed as estimated charge divided by total charge capacity, taking into account the electromotive force (EMF). An EMF vs. SOC curve may thus be derived from test results or a standard data sheet supplying information about the battery or battery type.

For the exemplary model shown in FIG. 2, for estimation of the series resistance $R_0$, a number of previously obtained battery voltages and currents may be stored, for example the previous 10 values obtained for the battery voltage $V_L$ and battery current $I_L$ may be stored. The minimum and maximum current from these stored values may be determined. The corresponding voltages may be converted to SOC as is, e.g. the battery voltage $V_L$ values may be used directly as EMF values to estimate SOC.

For example, Ohm's law may be applied to estimate $R_0$ under normal operating conditions of the battery, e.g. under normal voltage levels and for a large enough current change. Therefore, $V_L$ may be required to be in the range of the EMF corresponding to a 10% SOC and the EMF corresponding to a 90% SOC, in combination with a current step of at least 1 C, in order to determine $R_0$. For example, for a 10 Ah battery, a sequence of for instance ten current and voltage samples may be determined. If the difference between maximum and minimum current in the series exceeds 10 A, which corresponds to 1 C, and the minimum and maximum voltage are both between 2.7 and 3.8 V, $R_0$ may be calculated as the difference between maximum and minimum voltage, say 0.08 V, divided by the difference between the maximum and minimum current, say 20 A, e.g. $R_0 = 0.08 \text{ V} / 20 \text{ A} = 4 \text{ m}\Omega$.

Estimation of the EMF from the battery voltage measurement, for the model $EMF = V_L - R_0 \cdot I_L - I_P \cdot R_P$, is obtainable from a linear relation $y = ax + b$, where $x = I_P$, $b = EMF$, $a = R_P$ and $y = V_L - R_0 I_L = OCV$. As the open circuit voltage OCV is known from the voltage and current measurement values $V_L$ and $I_L$, and the estimated $R_0$, a linear fit may be used to find a best fit estimate, e.g. a least square error estimate, for a and b given an plurality of values for $I_P$. The values for $I_P$ may be derived from $I_L$ by $$\frac{dI_P}{dt} = \frac{I_L(t) - I_P}{\tau},$$

or, after discretization, $$\frac{I_{P,k} - I_{P,k-1}}{\Delta t} = \frac{I_{L,k-1} - I_{P,k-1}}{\tau},$$

in which $\tau$ may be selected to allow acceptable responsivity of the model to relaxation effects, e.g. 50 s.

The method 10, as illustrated schematically in FIG. 1, further comprises the step of determining 18 an error value for the ancillary charge estimate value, in which this error value expresses the reliability of the battery model taking the battery voltage measurement value $V_L$ into account. In embodiments of the present invention, this error value may be expressed as the estimated error of the ancillary charge estimate value $z_k$ of the battery, e.g. the SOC, made for a given value for EMF that is derived from the measured cell voltage. Thus, the error value may be determined as function of an estimated error corresponding to the step of determining 16 the ancillary charge estimate value $z_k$ using a battery model taking into account the battery voltage measurement value $V_L$ and the battery current measurement $I_L$. This error value may for example be assigned a high value when the EMF vs SOC curve is flat, e.g. when SOC may vary over a wide range for only small variations in EMF, e.g. may be assigned a value of 20%, and may be assigned a low value near full and/or near empty battery, e.g. a value of 1%. Furthermore, in cases where battery relaxation is difficult to model, the error value may be determined as function of the battery current measurement value $I_L$.

The method 10 also comprises the step of applying 20 a correction to the primary charge estimate value as function of the ancillary charge estimate value and the error value. The applying 20 of the correction may comprise applying 21 an update step of the linear quadratic estimation method such as the Kalman Filter described hereinabove, e.g. applying 20 the correction may comprise an update of linear quadratic estimation method such as a Kalman update corresponding to the prediction step of linear quadratic estimation method such as the Kalman prediction step 15, e.g. for updating the primary charge estimate value $Q_k$. The linear quadratic estimation method such as the Kalman Filter may thus comprise an observation variable commensurate with the ancillary charge estimate value $z_k$, which has an associated variance R commensurate with said error value.

This correction of the linear quadratic estimation method such as the Kalman correction may be determined by applying the ancillary charge estimate value $z_k$ of the battery as an observation variable such as a Kalman observation variable. For example, following the notation introduced hereinabove in the prediction step 15, e.g. the Kalman prediction step 15, this applying 21 of a correction such as a Kalman correction may be formulated as $\hat{x}_k = \tilde{x}_k + K_k(z_k - H_k \tilde{x}_k)$, in which the observation matrix $H_k$ expresses the relationship between the ancillary charge estimate value $z_k$ of the battery, e.g. an SOC, and the primary charge estimate value $Q_k$, and $K_k$ expresses a gain such as the Kalman gain. Particularly, as $x_k$ an $z_k$ have been reduced to scalars, $H_k$ may be a scalar scaling value taking into account the total capacity of the battery, e.g. the charge capacity when fully charged. $H_k$ is denoted as the transfer function from charge [C] to SOC [%].

The step of applying 21 the update of the linear quadratic estimation method such as the Kalman update may comprise calculating a gain such as the Kalman gain $K_k$ taking the error value, determined 18 for the ancillary charge estimate value $z_k$, into account, e.g. this error value determines a variance R such as the Kalman variance R for the observed variable $z_k$. In embodiments of the present invention the gain may be calculated in a different way even that the gain may be constant.

In embodiments of the present invention, this observed variable variance R such as the Kalman observed variable variance R may be expressed as the estimated error in relative charge state value of the battery (SOC) made for a given value for EMF that is derived from the measured cell voltage using the expressions above. Thus, the variance R may be determined as function of the ancillary charge estimate value $z_k$ of the battery using a battery model taking into account the battery voltage measurement value $V_L$ and the battery current measurement value $I_L$. This variance R may for example be assigned a high value when the EMF vs SOC curve is flat, e.g. a value of 20%, and may be assigned a low value near full and/or near empty battery, e.g. a value of 1%. Furthermore, in cases where battery relaxation is difficult to model, the variance R can be determined as function of the battery current measurement $I_L$.

The linear quadratic estimation method described above such as the Kalman filter described hereinabove may be considered as a first order filter on the charge estimate value Q, with a time constant of $1/(K_k \cdot H_k)$. $H_k$ expresses a transfer function from the charge estimate value, e.g. measured in Coulomb, to the relative charge state, e.g. SOC expressed as percentage, so it may be considered substantially constant, e.g. may preferably only change significantly over many charge-discharge cycles of the battery. This time constant of the linear quadratic estimation method such as the Kalman filter may further depend on the variance S of error of the current sensor used. This variance S of the measurement error may for example be derived from the datasheet of the current sensor by multiplying the relative error of the sensor by the sensor full scale and by the sampling interval, e.g. 0.5%×100 A×0.5 sec.

The highest estimation precision is preferably achieved when the battery is either nearly full or nearly empty. In order to illustrate the performance of a method according to embodiments of the present invention, it is to be noted that these operational areas may imply a low value for the variance R. For example, assuming an average value for the relative charge state (SOC) of 97%, a 12 Ah battery, S=0.25 As, R=3%, H=0.0022, then 1/KH converges to 1560 cycles, or 780 s for a sample rate of 2 Hz.

For a nearly fully charged state, the variance would typically be small, since the high battery voltage measured may be taken to imply a small estimation error of the relative charge state. However, a lower intermediate time constant may be desirable to allow compensation for uncertainties induced by relaxation. Referring again to FIG. 2, a $C_p$-$R_p$ circuit may be included in the battery model with a suitable time constant to provide such lower intermediate time constant. The time constant for this part of the circuit may be chosen such as to complement the corrections of the linear quadratic estimation method such as the Kalman corrections, e.g. in the range of 10% to 30% of a time constant such as the Kalman time constant described hereinabove, e.g. a time constant of 150 seconds for the example given here-above.

Figure 3:
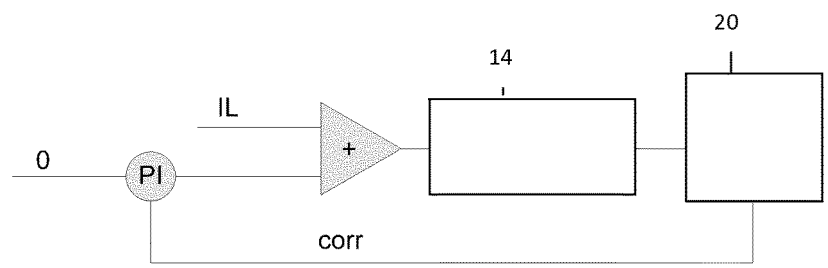
FIG. 3 shows an exemplary proportional feedback arrangement for correcting a systematic current error according to embodiments of the present invention.

Furthermore, the method 10 may comprise the step of determining 22 a systematic error of the battery current measurement, e.g. a battery current measurement offset, which may correspond to an offset error of the ammeter or current sensor used to measure the battery current $I_L$. For example, the correction term such as the Kalman correction term $K_k(z_k-H_k\hat{x}_k)$ may form an input for proportional-integral (PI) feedback to a current offset value, e.g. as shown in FIG. 3. In this example, the correction term such as the Kalman correction term is fed into a PI filter, which results in a corrective value, which may be applied, e.g. added, to a current sensor reading to correct the offset of the current sensor measurement value $I_L$. The proportionality factor P may be chosen to correspond to a timeframe of several hours, e.g. to $1/10000$ cycles=$1/5000$ s for a sampling rate of 2 Hz.

Furthermore, the method 10 as illustrated diagrammatically in FIG. 1, may comprise the step of determining 24 a total charge capacity of the battery taking into account the correction to the primary charge estimate value. For example, if the assumed total charge capacity of the battery is not correct, e.g. is either higher or lower than the real capacity, each time the battery becomes full or empty, the correction to the primary charge estimate value will be in a direction which indicates either an overestimation or underestimation of the real capacity. Therefore, a proportional-integral (PI) feedback may be used to update the total capacity estimate, taking the correction, e.g. the Kalman correction term, as an input.

For example, the correction, e.g. the Kalman correction term may be fed into a PI input, while the PI output is added to a total capacity estimate, e.g. to obtain an updated total capacity estimate. This correction may be only relevant when the battery is nearly full or nearly empty, e.g. the correction may be only performed when the estimated SOC is, for example, larger than 97% or, for example, smaller than 5%. If the capacity estimate is correct, the correction term values such as the Kaman correction term values will be normally distributed around zero, such that the output of the PI is zero. Alternatively, the output of the PI may be added only once per battery cycle to the total capacity estimate, e.g. when the SOC drops below 97%.

Figure 4:
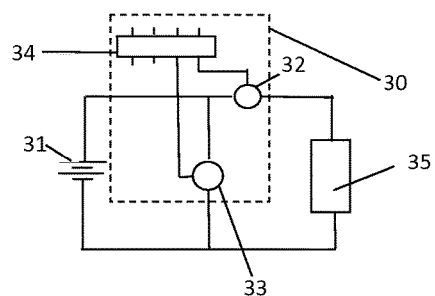
FIG. 4 shows a device according to embodiments of the present invention.

In a second aspect, the present invention relates to a device for monitoring the charge of a battery. Referring to FIG. 4, a device according to embodiments of the present invention is shown. The device 30 monitors the charge of a battery 31, e.g. a battery connected to a load 35, for example a load 35 comprising a power bus system for powering an electric or hybrid vehicle. The device 30 comprises a current sensor, e.g. an ammeter 32, for providing a battery current measurement, e.g. for measuring the current coming from or going into the battery; a voltage sensor, e.g. a voltmeter 33, for providing a battery voltage measurement, e.g. for measuring the electric potential over the battery poles; and a processing unit 34. Furthermore, the device may also comprise at least one other type of sensor, such as a temperature sensor.

The processing unit 34 is adapted for applying a current integration method to update a primary charge estimate value representative of the charge stored in the battery by taking into account the battery current measurement value and for determining an ancillary charge estimate value representative of the charge stored in the battery using a battery model taking into account the battery voltage measurement value. The processing unit 34 is further adapted for determining an error value for the ancillary charge estimate value, in which this error value expresses the reliability, e.g. the accuracy, of the battery model taking the battery voltage measurement value into account. The processing unit 34 is also adapted for applying a correction to the primary charge estimate value as function of the ancillary charge estimate value and the error value.

Particularly, the processing unit 34 may be adapted for performing steps of a method according to the first aspect of the present invention, e.g. the steps of applying 14 current integration, determining 16 an ancillary charge estimate, determining 18 an error value and/or applying 20 a correction to the primary charge estimate value and/or determining 22 a systematic error of the battery current measurement value (k) taking into account said correction to the primary charge estimate value, as discussed hereinabove.

Aspects of the present invention also relate to the use of a device according to embodiments of the second aspect of the present invention for monitoring the charge stored in a battery for powering an electric or hybrid vehicle, or for storing energy for electric power back-up units.

The invention claimed is:

1. A method for determining whether to change a battery in an electric or hybrid vehicle or in electric power back-up units, the method comprising:

obtaining a battery current measurement value (k) using a current sensor having a predetermined current offset and recorded at regular time intervals and obtaining a battery voltage measurement value using a voltage sensor and recorded at regular time intervals, said battery current measurement value (k) being a battery current (IL) entering or leaving a battery having battery poles including said current offset and said battery voltage (VL) being a battery voltage (VL) across the battery poles, using a processor to apply a current integration method to update a primary charge estimate value representative of the charge stored in the battery by integrating the battery current measurement value including the current offset over time, the current integration method being implemented as a prediction step of a one-dimensional linear quadratic estimation method for recursively updating an estimated quantity which reflects an underlying system state corresponding to the charge stored in the battery, taking into account a sequence of noise input data, based on a previously determined primary charge estimate value as an a-posteriori state estimate of a previous time instance, where the primary charge estimate value (Qn) is considered as an a-priori state estimate of a scalar hidden state variable representing the true, yet unknown, electrical charge stored in the battery, determining an ancillary charge estimate value representative of the charge stored in the battery using a battery model taking into account the battery voltage measurement value (VL), wherein the determining of the ancillary charge estimate value (zk) representative of a relative charge state of the battery being a state-of-charge (SOC) value expressed as a fraction of a total charge capacity of the battery, the determining of the ancillary charge estimate value (zk) being performed by using a battery model with the battery voltage measurement value (VL) as a parameter, being an electromotive force (EMF) of the battery from a predetermined calibration curve of the EMF and the SOC, determining an error value for said ancillary charge estimate value, said error value expressing the reliability accuracy of said battery model taking the battery voltage measurement value (VL) into account, applying a correction to the primary charge estimate value as a function of the ancillary charge estimate value and the error value by applying an update step of the linear quadratic estimation method to the prediction step of the linear quadratic estimation method for updating the primary charge estimate value (Qk), the correction of the linear quadratic estimation method being determined by applying the ancillary charge estimate value (zk) of the battery as an observation variable, determining a systematic error of the battery current measurement value (k) taking into account said correction to the primary charge estimate value, determining an estimated total charge capacity of the battery taking into account said correction to the primary charge estimate value, monitoring the charge of the battery taking into account the systematic error, wherein the systematic error is fed into a feedback loop to compensate for the integration of the current offset and to update the estimated total capacity of the battery, determining a battery age or state of health of the battery based on a change of the total capacity of the battery over time, and replacing the battery based on a poor battery age or state of health of the battery.

2. The method according to claim 1, in which said linear quadratic estimation filter method is selected form a one-dimensional linear quadratic estimation filter method, a Kalman filter, a Sequential Kalman filter, an Information filter, a Cholesky matrix square root algorithm, a Potter's square root measurement-update algorithm, the Household algorithm, the Gram-Schmidt algorithm, the U-D measurement update, the U-D time update, or the particle filter.

3. The method according to claim 1, in which applying the current integration method comprises performing a prediction step of a Kalman filter to update said primary charge estimate value, wherein said primary charge estimate value is a Kalman prediction value of a hidden state variable corresponding to the charge stored in the battery, and said Kalman filter further comprises a control variable commensurate with said battery current measurement value (IL).

4. The method according to claim 3, in which said Kalman filter is a one-dimensional Kalman filter.

5. The method according to claim 1, in which said determining the ancillary charge estimate value takes the battery current measurement value (IL) and/or a battery temperature measurement into account.

6. The method according to claim 1, further comprising the step of when each time the battery becomes full or empty, updating the estimated total charge capacity taking into a direction of the correction of the primary charge estimate value.

7. The method according to claim 1, wherein the battery model is an electrical model with a series resistor and a resistor/current parallel network.

8. The method according to claim 1, wherein the error value for said ancillary charge estimate value is assigned a high value when the SOC varies over a wide range for small variations in the EMF and assigned a low value when the battery is near a full or near empty state.

9. A device for monitoring the charge of a battery in an electric or hybrid vehicle or in electric power back-up units, comprising:

a current sensor for providing a battery current measurement value (IL) entering or leaving a battery having poles that is recorded at regular time intervals, the current sensor having a predetermined current offset, a voltage sensor for providing a battery voltage measurement value (VL) across the battery poles that is recorded at regular time intervals, and a processing unit comprising:

means for applying a current integration method to update a primary charge estimate value representative of the charge stored in the battery by integrating the battery current measurement value over time including integrating the current offset, the current integration method being implemented as a prediction step of a one-dimensional linear quadratic estimation method for recursively updating an estimated quantity which reflects an underlying system state corresponding to the charge stored in the battery, taking into account a sequence of noise input data, based on a previously determined primary charge estimate value as an a-posteriori state estimate of a previous time instance, where the primary charge estimate value (Qn) is considered as an a-priori state estimate of a scalar hidden state variable representing the true, yet unknown, electrical charge stored in the battery, means for determining an ancillary charge estimate value representative of the charge stored in the battery using a battery model taking into account the battery voltage measurement value (VL), wherein the means for determining the ancillary charge estimate value (zk) representative of a relative charge state of the battery being a state-of-charge (SOC) value expressed as a fraction of the total charge capacity of the battery, the determining of the ancillary charge estimate value (zk) being performed by using a battery model with the battery voltage measurement value (VL) as a parameter, being an electromotive force (EMF) of the battery from a predetermined calibration curve of the EMF and the SOC, means for determining an error value for said ancillary charge estimate value, said error value expressing the reliability accuracy of said battery model taking the battery voltage measurement value (VL) into account, means for applying a correction to the primary charge estimate value as function of the ancillary charge estimate value and the error value by applying an update step of the linear quadratic estimation method to the prediction step of the linear quadratic estimation method for updating the primary charge estimate value (Qk), the correction of the linear quadratic estimation method being determined by applying the ancillary charge estimate value (zk) of the battery as an observation variable, means for determining a systematic error of the battery current measurement value taking into account said correction to the primary charge estimate value and for determining an estimated total charge capacity of the battery taking into account said correction to the primary charge estimate value, wherein said processing unit has means for determining whether to change the battery by monitoring the charge of the battery taking into account the systematic error wherein the systematic error is fed into a feedback loop to compensate for the integration of the current offset and to update the estimated total capacity of the battery, and a means for providing a fuel gauge based on the estimated total charge capacity of the battery and the state of charge of the battery, wherein a battery age or state of health of the battery is determined based on a change of the total capacity of the battery over time, and replacing the battery based on a poor battery age or state of health of the battery.

10. The device according to claim 9, wherein a Kalman filter is adapted to update said primary charge estimate value, wherein said primary charge estimate value is a Kalman prediction value of a hidden state variable corresponding to the charge stored in the battery, and said Kalman filter further comprises a control variable commensurate with said battery current measurement value.

11. The device of claim 9, the filter method is selected from a Kalman filter, a Sequential Kalman filter, an Information filter, a Cholesky matrix square root algorithm, a Potter's square root measurement-update algorithm, the Household algorithm, the Gram-Schmidt algorithm, the U-D measurement update, the U-D time update, or the particle filter.

12. A device for monitoring the charge of a battery in an electric or hybrid vehicle or in electric power back-up units, comprising:
  a current sensor for providing a battery current measurement value (IL) entering or leaving a battery having poles that is recorded at regular time intervals, the current sensor having a predetermined current offset,
  a voltage sensor for providing a battery voltage measurement value (VL) across the battery poles that is recorded at regular time intervals, and
  a processing unit comprising:
  wherein said processing unit is configured to apply a current integration method to update a primary charge estimate value representative of the charge stored in the battery by integrating the battery current measurement value over time including integrating the current offset, the current integration method being implemented as a prediction step of a one-dimensional linear quadratic estimation method for recursively updating an estimated quantity which reflects an underlying system state corresponding to the charge stored in the battery, taking into account a sequence of noise input data, based on a previously determined primary charge estimate value as an a-posteriori state estimate of a previous time instance, where the primary charge estimate value (Qn) is considered as an a-priori state estimate of a scalar hidden state variable representing the true, yet unknown, electrical charge stored in the battery,
  wherein said processing unit is configured to determine an ancillary charge estimate value representative of the charge stored in the battery using a battery model taking into account the battery voltage measurement value (VL),
  wherein said processing unit is configured to determine an ancillary charge estimate value (zk) representative of a relative charge state of the battery being a state-of-charge (SOC) value expressed as a fraction of the total charge capacity of the battery, and wherein the determining of the ancillary charge estimate value (zk) is performed by using a battery model with the battery voltage measurement value (VL) as a parameter, being an electromotive force (EMF) of the battery from a predetermined calibration curve of the EMF and the SOC,
  wherein said processing unit is configured to determine an error value for said ancillary charge estimate value, said error value expressing the reliability accuracy of said battery model taking the battery voltage measurement value (VL) into account,
  wherein said processing unit is configured to apply a correction to the primary charge estimate value as function of the ancillary charge estimate value and the error value by applying an update step of the linear quadratic estimation method to the prediction step of the linear quadratic estimation method for updating the primary charge estimate value (Qk), the correction of the linear quadratic estimation method being determined by applying the ancillary charge estimate value (zk) of the battery as an observation variable,
  wherein said processing unit is configured to determine a systematic error of the battery current measurement value taking into account said correction to the primary charge estimate value and for determining an estimated total charge capacity of the battery taking into account said correction to the primary charge estimate value,
  wherein said processing unit is configured to determine when to change the battery by monitoring the charge of the battery taking into account the systematic error, wherein the systematic error is fed into a feedback loop to compensate for the integration of the current offset and to update the estimated total capacity of the battery, and to determine a battery age or state of health of the battery based on a change of the total capacity of the battery over time, and replace said battery based on a poor battery age or state of health of the battery.

* * * * *